United States Patent [19]

Russillo, Jr. et al.

[11] Patent Number: 5,027,056

[45] Date of Patent: Jun. 25, 1991

[54] MULTIFUNCTION REGISTER ENCLOSURE FOR ENERGY METER

[75] Inventors: Joseph G. Russillo, Jr., Rollinsford; Richard A. Balch, North Hampton; Andrius A. Keturakis, Portsmouth; Scott D. Velte, Rochester, all of N.H.

[73] Assignee: General Electric Company, Somersworth, N.H.

[21] Appl. No.: 505,195

[22] Filed: Apr. 5, 1990

[51] Int. Cl.⁵ .................... G01R 1/20; G01R 11/04
[52] U.S. Cl. .................... 324/103 R; 324/156; 324/157; 324/96
[58] Field of Search ........... 324/156, 157, 142, 103 R, 324/137, 96; 361/364, 366, 367, 372, 394; 364/483, 492

[56] References Cited

U.S. PATENT DOCUMENTS

| | | | |
|---|---|---|---|
| 3,943,413 | 3/1976 | Keever | 361/372 |
| 4,110,814 | 8/1978 | Britton et al. | 361/372 |
| 4,298,839 | 11/1981 | Johnston | 324/157 |
| 4,491,789 | 1/1985 | Benbow | 324/157 |
| 4,584,527 | 4/1986 | Amigo | 324/157 |
| 4,602,211 | 7/1986 | Losapio et al. | 324/103 R |
| 4,783,623 | 11/1988 | Edwards et al. | 340/870.02 |

Primary Examiner—Kenneth Wieder
Assistant Examiner—Vinh P. Nguyen
Attorney, Agent, or Firm—Robert E. Brunson; Irving M. Freedman

[57] ABSTRACT

An electronic time of use or demand register is provided for selective addition to a watthour meter in an energy meter. The electronic register is configured for parallel mounting beside the watthour meter to minimize space and includes an integral register enclosure for properly assembling and securing various components in positive operational relationships such as positioning the optical detection assembly relative to the rotating castellated shutter and in turn positioning the optical communications link relative to the optical detection assembly. The register enclosure additionally includes integral means for mounting the electronic register within the energy meter and for selectively adding and positioning a plurality of optional features.

42 Claims, 3 Drawing Sheets

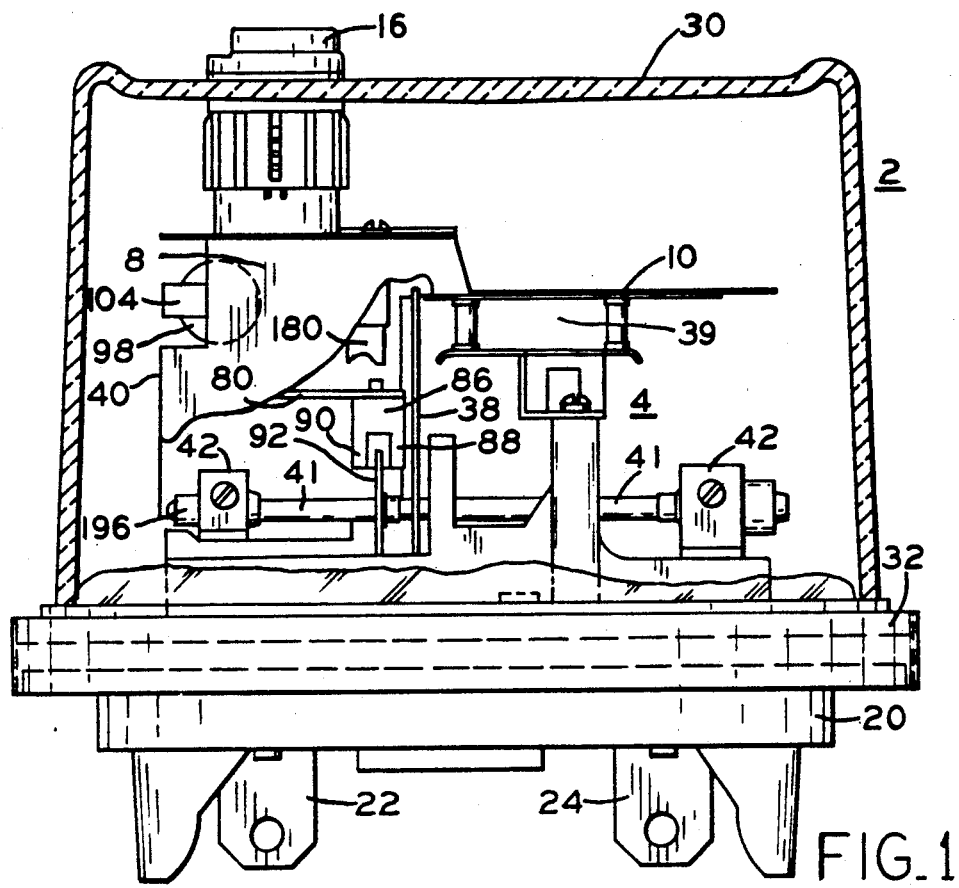
FIG._1
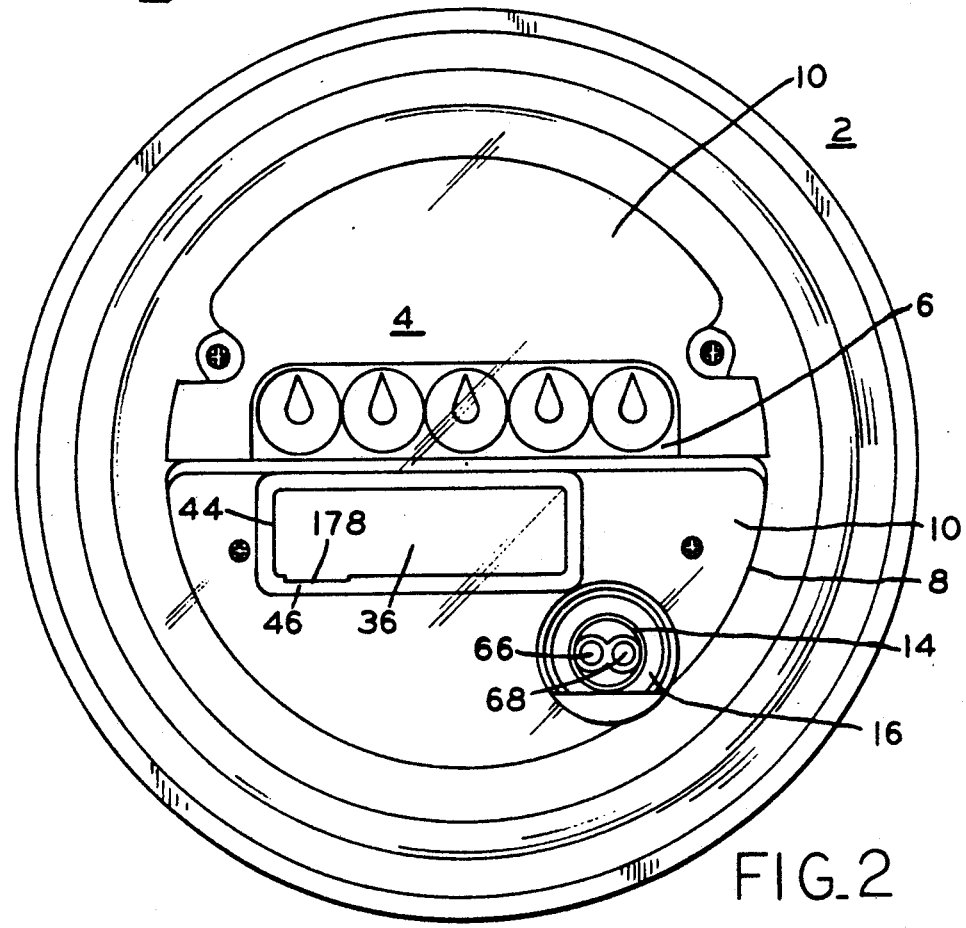
FIG._2

MULTIFUNCTION REGISTER ENCLOSURE FOR ENERGY METER

BACKGROUND OF INVENTION

The present invention relates to electric energy meters, and more particularly to a multifunction electronic register configured to be selectively added to a watthour meter.

The use of electronics in electric energy meters has enabled the design of energy meters with greatly increased capability and functions. However, there is increasing pressure for such meters to have fewer parts and to be substantially smaller than previous designs, and to incorporate additional capability and functions. Fewer parts are required in order to minimize manufacturing costs, including the cost of materials and assembly, and the subsequent cost and number of components which must be maintained for spare parts and repair purposes, along with an increase in reliability which accompanies designs which have fewer parts.

In electronic registers, it is well known to utilize an electro-optical link to read time of use of energy consumed by the load being metered, and also to program the microprocessor with desired time of use metering information from outside the energy meter without removing the cover. In a combination induction electric watthour meter and time of use electronic register, the watthour meter utilizes an eddy current disk which rotates in response to the rate of energy consumption by the load being metered. A shutter is commonly mounted on the same shaft as the eddy current disk, and is positioned to rotate between a light emitter and a light detector pair. A plurality of circumferential teeth on the rotating shutter sequentially break the light beam between the light emitter and light detector pair to provide a series of electrical pulses, the frequency of which is directly proportional to the rate of energy consumption by the load being metered. An optical communications link between the energy meter optical system and the outside of the meter is provided for interfacing to a portable reader, providing a means for extracting billing data and for programming the energy meter.

The use of such multiple optical transmission paths within the electronic register provides problems of accurately positioning and retaining a multiplicity of optical electronic components within the electronic register.

In addition, it is highly desirable to simplify the manufacture of electric energy meters, which would decrease the cost of manufacture and assembly, by minimizing the number of parts required and thus lower the cost and problems associated with stocking spare parts and providing repairs. Electronic registers are optional features to provide time of use or demand of energy consumption data for billing purposes in addition to providing the total watthour or kilowatthour power consumption. As such, it is desirable to be able to selectively add an electronic resister to a standard watthour meter design, which is typically produced in large volumes. This enables the manufacturer to obtain the benefits of the large scale production of the standard kilowatthour meter, and the ability to optionally provide an electronic time of use register when required by the customer. Furthermore, various optional features such as switch closure output signals and multifunction switching are desirable as selective additions to the energy meter.

OBJECTS AND SUMMARY OF INVENTION

It is an object of the present invention to provide an electronic register assembly which can be selectively added to a standard watthour meter.

It is another object of the present invention to provide an electronic register assembly to accurately position and support the optical and electronic system components relative to one another and on the meter assembly.

It is a further object of the present invention to provide an electronic register assembly which is uncomplex yet provides great versatility in producing various optional features with a minimum of parts and manufacturing assembly time.

It is yet another object of the present invention to provide a simplified electronic register utilizing multifunction structural elements.

In one embodiment of the present invention, an optical electronic register is provided for selective addition to a watthour meter in an energy meter. The register is configured for assembling and supporting the components in correct operational positions relative to each other. The register enclosure is provided with multiple integral positioning and mounting members for positioning and supporting the register circuit board on which the optical detecting assembly is mounted such that the light emitter and detector pairs are positioned on opposite sides of the castellated shutter which rotates on the watthour meter shaft in response to rate of energy consumption by the load being metered. The register enclosure also includes an enclosure for the optical communications link from the register circuit board to the outside of the energy meter such that positioning the register circuit board within the registered enclosure also positions the components of the optical communications link.

The integral register enclosure also includes components for positioning and securing the electronic register within the energy meter beside, and in parallel with, the watthour meter. This includes two bosses on the interior of the register enclosure with shrouds to guide the register without damage to the teeth of the castellated shutter and a snap assembly including resilient jaws which snap around the bearing on the shaft supporting the optical disk. The register enclosure further includes integral means to position the output display and in combination with a resilient clip member including jaws at the ends which cooperate with retainers integral with the register enclosure to retain the readout within a readout aperture formed in the register enclosure.

The register enclosure also includes means to selectively add a plurality of features such as a test mode switch actuator-indicator, an optical coupler for an optical communications link with the outside of the register, and a backup battery to retain the memory in event of loss of power. The battery cavity is formed integral with the register enclosure, as are the cantilevered resilient clips which retain the hold over battery in position within the molded register enclosure. The register enclosure also includes slots and openings to position connectors, and to facilitate electrical connection to connectors on the register circuit board.

Still further, the register enclosure includes integral multifunction parts such as cylindrical posts which secure switch mechanisms while serving as spacers between the register circuit board and the register housing, and further includes the enclosure for the optical communications link.

The electronic register is configured for selective addition to a standard watthour meter replacing a semicircular nameplate with the electronic register including a nameplate and using two of the nameplate mounting bosses to secure the register in place. The register enclosure is further configured for the selective addition of an output circuit board to provide additional signals, such as contact closure signals, to the outside of the energy meter.

BRIEF DESCRIPTION OF DRAWINGS

FIG. 1 shows a simplified sectional view of an electric energy meter with an electronic register incorporating one embodiment of the present invention.

FIG. 2 is a top rotated view of the energy meter of FIG. 1.

Figure 3:
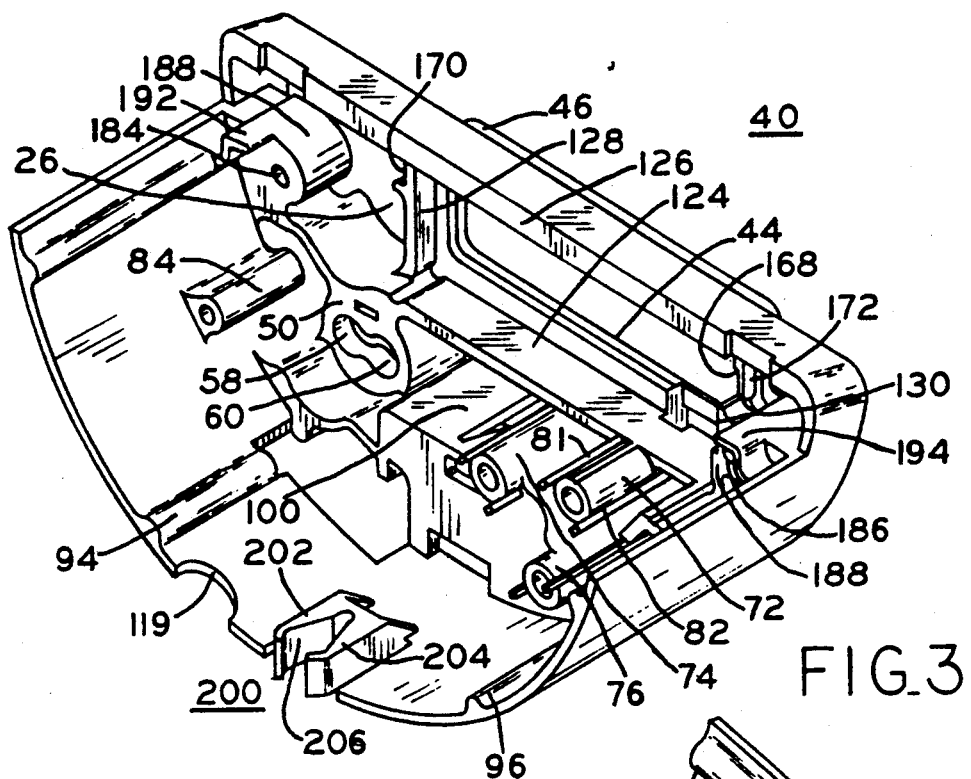
FIG. 3 is a perspective view of the register enclosure used in FIGS. 1 and 2 as viewed from inside the meter.

Referring first to FIGS. 1 and 2, an electric energy meter 2 includes an induction watthour meter 4 with a dial readout assembly 6 and including an electronic time of use or demand register 8. The electronic register 8 includes an optical readout 14 within optical coupler or port 16. As best shown in FIG. 1, the energy meter 2 includes a molded base 20 having a plurality of meter circuit terminals such as 22 and 24, extending through the base to connect the meter in circuit with a power source and a load which is to be metered. A transparent cover or housing 30 in combination with a ring clamp assembly 32 surrounds the meter components and in combination with the base 20 encloses the assembly. The transparent cover housing is commonly made of glass, or a transparent polycarbonate such as Lexan, a trademark of General Electric Company.

In a manner well known in the art, the induction watthour meter 4 includes an eddy current disk 38 mounted on shaft 41 for rotation within a pair of bearings 42 responsive to the rate that energy is being consumed by a load connected in circuit with the terminals 22 and 24 of the electric energy meter 2. The dial readout assembly 6 (see FIG. 2) integrates or totalizes the revolutions of the eddy current disk 38 through gearing 39 to provide an indication of kilowatt hour energy consumption by the load being metered. The electronic register 8 provides a plurality of different information including the rate and time of use of electric energy.

Figure 4:
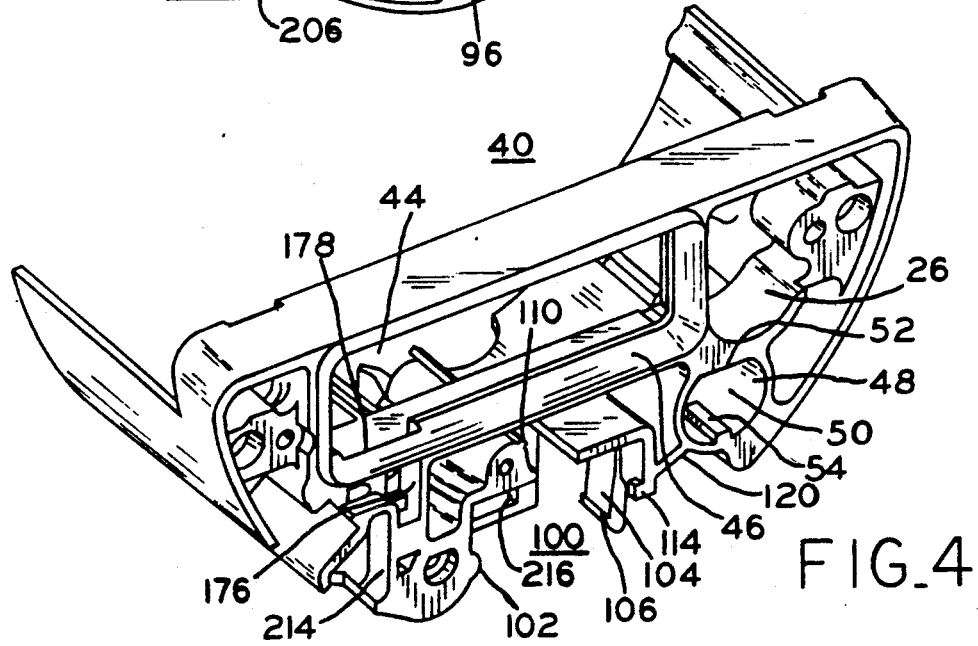
FIG. 4 is a perspective view of the register enclosure used in FIGS. 1 and 2 as viewed from outside the meter.

The electronic register 8 further includes the liquid crystal display 36 positioned within the aperture 44 of the register enclosure 40 surrounded by a rim 46 which is integrally molded as part of the register enclosure. Also molded integral with the register enclosure 40 is the light enclosure 50 of the optical readout 14 which, as shown in FIGS. 3 and 4, includes a substantially cylindrical chamber in the front portion having a flatted side 52 and an axial positioning rib 54 which is used to align and position a programming adaptor as shown and described in detail in the copending U.S. Pat. application, Ser. No. 505,970 of A.A. Keturakis and S.D. Velte assigned to the same assignee as the present invention and hereby incorporated by reference.

Figure 8:
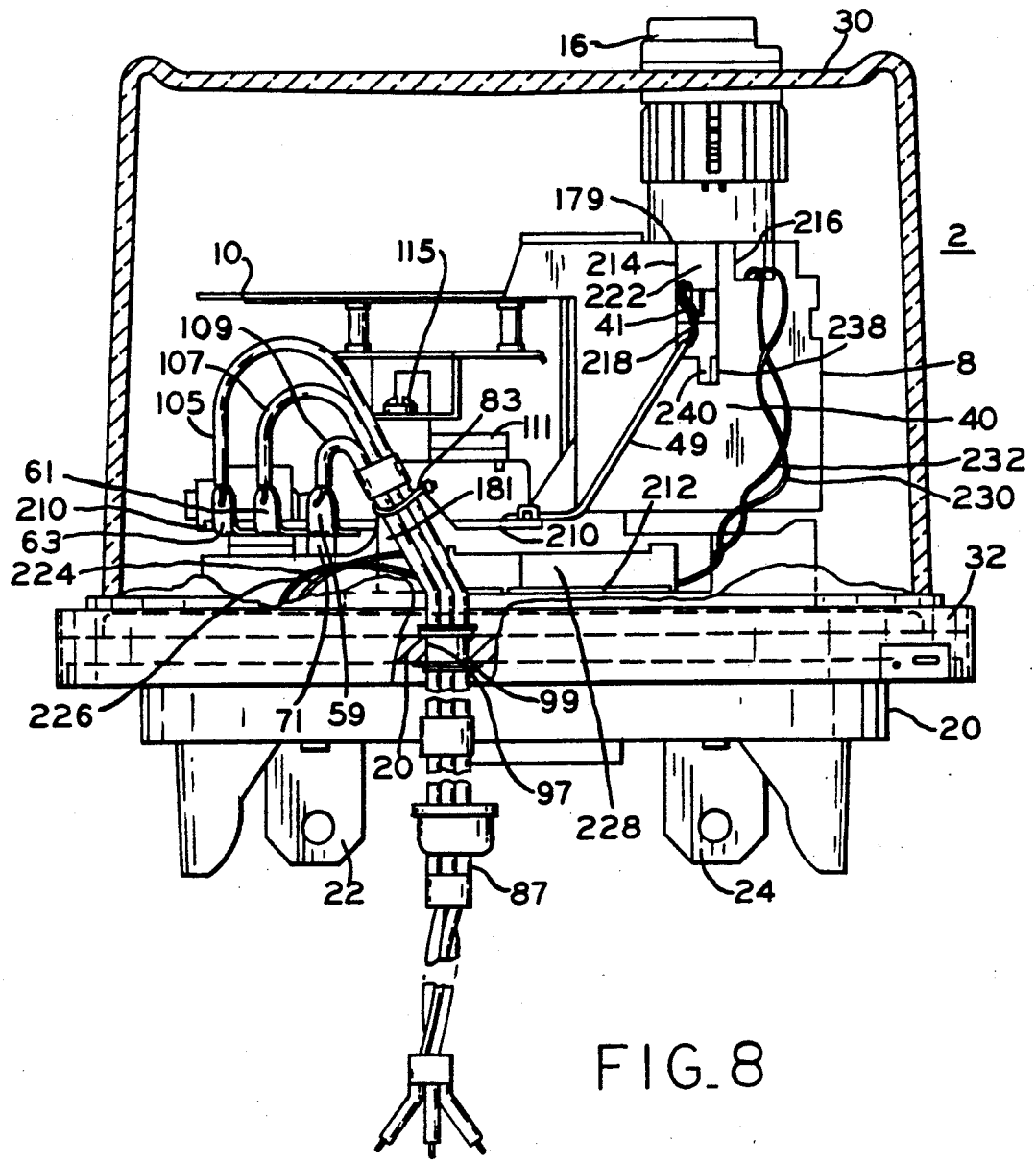
FIG. 8 a sectional view of the electric energy meter of FIGS. 1 and 2 showing the optional output feature and electrical connections to the electronic register.

The interior portion of the light enclosure 50 includes a pair of adjoining cylindrical openings 58 and 60 which form a substantially figure-8 opening, which position and support the light emitting diode 66 and associated light detector 68 (see FIG. 2) which are used to optically couple signals between the exterior and the interior of the electronic register 8 as described in more detail in the aforesaid U.S. Pat. application, Ser. No. 505,970.

The integral register enclosure 40 is injection molded of 9% glass filled polycarbonate, and includes the multifunctioning positioning and mounting means for a plurality of switching means, including those which are made available for actuation from outside the meter to enable switching to a plurality of functions and modes of operation to be displayed by the liquid crystal display 36. Switches are used for resetting the demand register and the display of other supplemental or alternate information and/or functions including, for example, alternate display scroll. However, the liquid crystal display 36 is not capable of simultaneously displaying all of the data or functions which may be provided and/or displayed. Also, it is not desirable to continuously display all of such data. The switch mechanisms extend from the outside of the register enclosure 40 to the switches mounted on and pass through the tubular members 74 and 76, each of which includes a pair of cylindrical posts such as 81 and 82, also molded integral with the register enclosure 40 and extending substantially parallel to the tubular members. Since the rotary actuator which actuates the switch mechanisms positioned behind the tubular members 74 and 76 is mounted on the transparent cover 30 of the electronic energy meter 2, it is necessary that the switch mechanisms be positioned accurately relative to one another for actuation. A suitable external rotary actuator and switching arrangement is described in more detail in the copending U.S. Pat. application Ser. No. 411,9663, of P. F. Coryea and W. R. Germer, (now U.S. Pat. No. 4,959,607) and U.S. Pat. No. 4,602,211, of P. F. Losapio and W. R. Germer, both of which are assigned to the same assignee as the present invention, and are hereby incorporated by reference.

Figure 5:
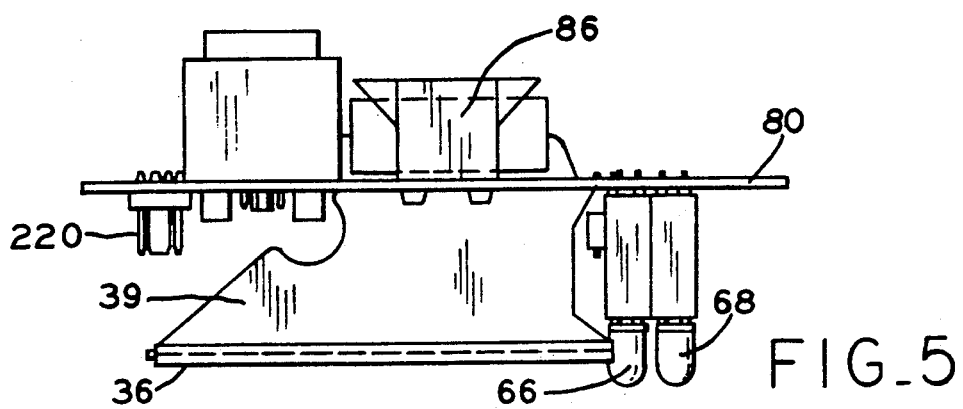
FIG. 5 the register circuit board and its principal components.

The register enclosure 40 additionally includes and provides positive positioning for the register circuit board 80 (see FIGS. and 5) on a pair of integrally molded bosses 84, one of which is shown in FIG. 3. As shown in FIG. 1, the register circuit board 80 supports the disk sensing optics assembly 86 which includes the spaced jaws 88 and 90 within which the toothed or castellated shutter 92 mounted on shaft 41 rotates as described in detail in copending U.S. Pat. application Ser. No. 505,383 of A.A. Keturakis, R.C. Mayo, and S.D. Velte, assigned to the same assignee as the present invention, and hereby incorporated by reference. Light emitter and light detector pairs positioned within the spaced jaws 88 and 90 project light beams between the jaws which are interrupted by the teeth on the rotating shutter 92 at a rate which is proportional to the rate of energy consumption by the load being metered by the electronic energy meter 2. Thus, it becomes important to provide accurate positioning of the disk sensing optics assembly 86 relative to the toothed shutter 92. Also, as best shown in FIG. 5, in addition to the disk sensing optics assembly 86, the light emitter or light emitting diode 66 and the light detector 68 are also secured to, and positioned on, the register printed circuit board. As a result, securing the register circuit board 80 to the integral bosses 84 of register enclosure 40 also simultaneously positions the optical components including light emitting diode 66 and light detector 68 within the optical readout aperture formed by adjoining cylindrical openings 58 and 60 (see FIG. 3) to be properly aligned with and accessible to optical coupler 16 (see FIG. 2). Accordingly, the integral injection molded register enclosure 40 provides the accurate and important positioning of various optical elements within the electronic register 8 of the energy meter 2.

The positive and accurate positioning of the register circuit board 80 is further ensured by additional multi-function portions of the register enclosure 40. The spacing of the register circuit board 80 in the axial direction, that is toward the adjoining cylindrical openings 58 and 60, is also controlled by the cylindrical posts such as 81 and 82 (see FIG. 3) which support the switch mechanisms. Thus the posts 81 and 82 not only support the switches but also control the axial positioning of the register circuit board 80, which in turn positions the light emitter 66 and light detector 68 properly within the adjoining cylindrical openings 58 and 60 of the optical readout 14. The accurate positioning of the register circuit board 80 is still further ensured by use of the axial semi-circular ribs 94 and 96 which abut, position and support the periphery of the register circuit board when the register circuit board is slid into place about the ribs.

The flatted side 52 of the light enclosure 50 and the diametrically opposed axial positioning rib 54 (see FIG. 4) ensures the proper orientation and positioning of the programming adaptor (which is described in the aforesaid U.S. Pat. application Ser. No. 505,970 over the light emitter 66 and light detector 68 within the register enclosure 40. The external optical reader enables automatic reading of the optical electronic register 8, and also enables programming, or changes in the programming, of the microprocessor associated with the optical electronic register.

A battery compartment 100 is also formed within the injection molded integral register enclosure 40 as best shown in FIGS. 1 and 4. Referring to FIGS. 1 and 4, the battery compartment 100 is positioned below the aperture 44 for the liquid crystal display 36 and includes a lip 102 on one side to help secure the battery in place, and a cantilevered clamp 104 extending downward from the register enclosure 40 with a lip 106 at its free end. A second cantilevered clamp 110 extends downward from the register enclosure 40 at the top of the battery compartment. The hold over battery 98 may be readily and easily snapped into the battery compartment by hooking it behind lip 102 and pressing the battery into the battery compartment, compressing the cantilevered clamp 104 and the second cantilevered clamp 110 until the battery is fully inserted into the battery compartment at which time the resiliency of the compressed cantilevered clamps cause them to spring out with the lip 106 on the cantilevered clamp 104, and a corresponding lip on the second cantilevered clamp 110, surrounding and firmly securing the battery 98 in place. A projection 114 at the front of the battery compartment or chamber 100 molded integral with register enclosure 40 may be included to firmly and securely retain the battery 98 in position within the battery compartment 100. The hold over battery 98 is provided in the electronic register 8 to retain the memory in the microprocessor, and provide timekeeping, during periods of power down or power failures. The battery may be either the standard 1/2 AA cylindrical meter battery, or a larger rectangular rechargeable battery. One suitable type is the General Electric Part No. 9936620.

An or aperture opening 120 formed within the register enclosure 40 beside the battery compartment 100 allows the interconnection of the battery cable and connector to the register printed circuit board 80 which is positioned behind the aperture 120. Thus, the integral molded register enclosure 40 not only positions and supports the battery, but positions and supports the cooperating battery terminals which are positioned on the register circuit board 80 which is, in turn, positioned and secured on the register enclosure.

As best shown in FIG. 5, the liquid crystal display 36 is connected to the register circuit board 80 by a flexible heat seal connector 39. After the register circuit board 80 is installed on the integral register enclosure 40, by screwing it to the integral bosses 84 (see FIG. 3), the digital display 36 is secured within the aperture 44 formed in the register enclosure 40. The liquid crystal display 36 is slid within the compartment or nest formed by the shelf 124, the upper rim 126, and sides 128 and 130 all formed as part of the injection molded integral register enclosure 40. The liquid crystal display 36 is slid up against the rim 46 formed around and defining the aperture 44 for the liquid crystal display. The liquid crystal display 36 is then retained in place by the LCD retaining clamp 134 which is shown in FIGS. 6 and 7.

Figure 6:
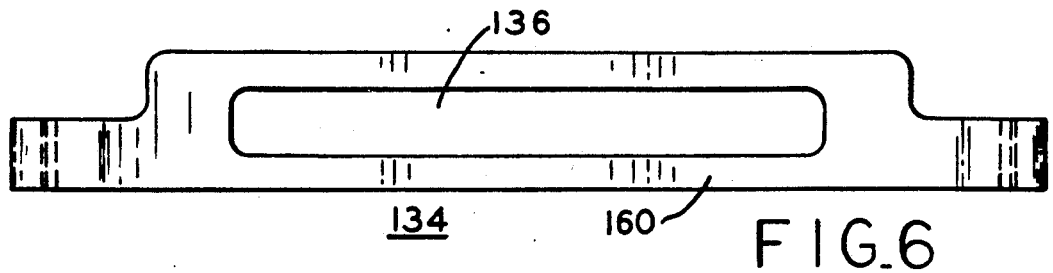
FIGS. 6 and 7 are enlarged views of the liquid crystal display retainer clip.
Figure 7:
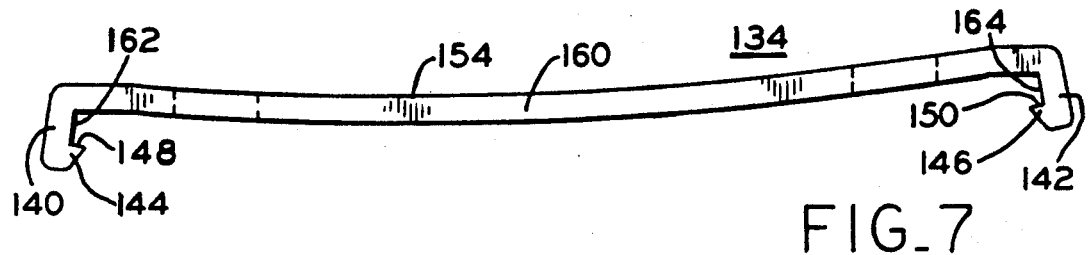

Referring to FIGS. 6 and 7, the LCD retainer clip 134 is a generally elongated member with a central aperture 136 and a pair of depending ends 140 and 142 which extend at substantially right angles to the central portion 160 which surrounds the central aperture 136. The depending ends 140 and 142 terminate in a lip or clamp surface 144 and 146, respectively, which form projecting surfaces 148 and 150, respectively, which are substantially parallel to the central portion 160 of the LCD retainer clip 134. The LCD retainer clip 134 is a single integral member which as molded from polycarbonate includes a curved or bowed surface 154. As best shown in FIG. 7, the curved surface 154 tends to open up the jaws 162 and 164; formed by the depending end 140 and projecting surface 148, and the depending end 142 and projecting surface 150, respectively. The LCD retainer clip 134 is positioned around the rear of the liquid crystal display 36 and secured to the register enclosure 40 to retain the liquid crystal display in position within the aperture 44. With the liquid crystal display 36 in place, the LCD retainer clip 134 is positioned across the rear surface with the jaws 162 and 164 contiguous to the clip retainers 168 and 170 formed integral with the molded register enclosure 40 in the upper regions of the aperture 44 as best shown 15 in FIG. 3.

Referring to FIG. 3, the clip retainers 168 and 170 extend vertically and are configured such that the jaws 162 and 164 are adapted to wrap around the clip retainers with a vertical surface of the clip retainers mating with projecting surfaces 148 and 150 of the jaws 162 and 164, respectively, to retain the LCD retainer clip 134 in place against the liquid crystal display 36, securing the liquid crystal display in place within aperture 44 of register housing 40. The clip retainers 168 and 170 each include a beveled surface, such as 172 shown on the clip retainer 168, to facilitate the jaws 162 and 164 sliding around the clip retainers during the installation of the LCD retainer clip 134. Assembly of the LCD retainer clip 134 is accomplished by initially hooking one jaw, such as 162, around the corresponding clip retainer 170, and then simply applying manual pressure through the other jaw 164 to bend the central portion 160 of the LCD retainer clip 134 flat against the rear of the liquid crystal display 136 to enable the depending end 142 of jaw 164 to slide around the clip retainer 168. Upon engagement of the jaw 164 with the projecting surface 150 in contact with the corresponding surface on the clip retainer, the resiliency of the compressed flattening of curved surface 154 causes the jaws 162 and 164 of LCD retainer clip 134 to close firmly and clamp around the clip retainers 168 and 170, respectively, retaining the liquid crystal display 36 in position within the aperture 44 of the register enclosure 40 for viewing from outside the energy meter 2.

The injection molded integral register enclosure 40 further includes provisions to position and secure a test mode actuator-indicator in opening 176 below and to the left side of the aperture 44 for the liquid crystal display 36. The test mode actuator-indicator is used to actuate the electronic register 8 to the test mode condition while at the same time providing an indicator warning flag which slides up through slot 178 (also see FIG. 2) to be positioned in front of, and obscure a small portion of, the liquid crystal display 36. The warning flag serves as a reminder that when the test mode is completed, the actuator-indicator should be moved to the off position, removing the warning flag from in front of the liquid crystal display and returning the register 8 digital readout 36 to the normal display mode of operation. The test mode actuator-indicator's construction and operation is described in detail in copending U.S. Pat. application Ser. No. 411,934, filed Sept. 25, 1989, of W.R. Germer, P.F. Coryea, A.A. Keturakis, D.H. Masury, and T.H. Stevens, (now U.S. Pat. No. 4,959,607) assigned to the same assignee as the present invention, and hereby incorporated by reference. The register enclosure 40 also supports the switch mechanism actuated by the actuator-indicator when the actuator-indicator is slid upward to the "test" position. The switch mechanism is mounted on and within the tubular member 72 and associated cylindrical posts 81 and 82, such that the test mode actuator-indicator is positioned by the register enclosure in proper operative relationship to its associated switch. Thus, the integral register enclosure 40 secures and positions still another group of register components in the proper operating position, by positioning the test mode actuator-indicator relative to the liquid crystal display 36 to indicate, and relative to its associated switch to actuate, all of which are supported by the register enclosure in operative relationship to each other.

The electronic register 8 may thus be completely manufactured and assembled independent of the induction watthour meter 4 of the energy meter 2, and may be selectively installed on those watthour meters for which the electronic register 8 feature is required. All that is required for interface between the electronic register 8, and the induction watthour meter 4 is the toothed shutter 92 on the rotatable shaft 41, and power leads. The shutter 92 can be assembled on the watthour meter 4 as manufactured enabling simplified selective addition of the optical electronic register 8 on only a portion of those manufactured, or alternatively, the watthour meter can be retrofitted by the addition of the optical disk only on those energy meters selected to include the register. In those energy meters including the electronic register 2 the nameplate is removed which not only provides access to position and mount the electronic register 8 within the energy meter 2, but also frees up nameplate mounting bosses 180 for positioning and securing the electronic register to the energy meter. The electronic register 8 which carries a substitute nameplate 179 identifying the combined watthour meter 4 and register 8 is attached to the energy meter 2 at three points. Two points of attachment are on the nameplate mounting bosses 180, a portion of one of which is shown in FIG. 1. A pair of precisely located hole and slot assemblies are molded integral with the register enclosure 40 for positioning on and about the nameplate mounting bosses 180. The hole and slot assemblies are best shown in FIG. 3. Referring to FIG. 3, a pair of holes 184 and 186 extend through the bosses 188, and shrouds or flanges 192 and 194 which extend from, and surround, a portion of the bosses 188, are configured to surround the nameplate mounting bosses 180 to position and assist in securing the electronic register 8 to the energy meter 2. The shrouds 192 and 194 also provide the additional function of initially guiding the electronic register 8 toward the bosses 188 and 190 and preclude inadvertent misalignment and downward motion which could result in breakage of the teeth on shutter 92 during installation of the register. Once the optical electronic register 8 is positioned on and around the nameplate mounting bosses 180, fastening screws (not shown) are passed through the holes 184 and 186 and screwed into tapped apertures within the nameplate mounting bosses 180.

The third mounting point for the optical electronic register 8 is located at the bottom of the register enclosure 40. As best shown in FIG. 3, the molded integral register 40 includes a snap member 200 which is positioned and configured to fit tightly around a cylindrical portion 196 of the left bearing 42 as shown in FIG. 1. As shown in FIG. 3, the snap member 200 includes a pair of resilient cantilevered jaws 202 and 204 positioned around a central circular aperture 206 which is dimensioned to provide an interference fit, and snap, around the cylindrical portion 196 of the bearing 42. The precision three-point mounting provided by the integral register enclosure 40 on the nameplate mounting bosses 180 and the cylindrical portion 196 of bearing 42 provides the positive positioning required in order that the disk sensing optics assembly 86 mounted on the register circuit board 80 will precisely be operatively positioned around the toothed shutter 92 which rotates about the shaft 41 which is rotatably positioned within the bearings 42. In addition, this three-point support system enables the combined induction watthour meter 4 and electronic register 8 to withstand harsh shipping and installation shocks without adverse affects, since upon installation of the electronic register, the resilient cantilevered jaws 202 and 204 provide a firm yet resilient mounting on the cylindrical portion 196 of bearing 42.

The register enclosure 40 also includes an aperture 26 to provide access to the watthour meter 4 full load adjustments, and an aperture 119 which provides access for the calibration light path through the anti-creep holes of the watthour eddy current disk 38. That is, the register enclosure 40 includes access apertures to the interior of the watthour meter for access to watthour meter load adjustments.

In addition to enabling and facilitating the selective addition of the electronic register 8 to the energy meter 2, the molded integral register enclosure 40 includes provision for, and is adapted to, the addition of an optional optical output circuit board which may be selectively added either during or after manufacture of the electronic register. This enables features such as contact closing output signals to be provided to the exterior of the meter for use outside the meter. The output circuit board is configured for fastening about a register mounting post such as 181 as described in detail in the copending U.S. Pat. application Ser. No. 505,287 of A.A. Keturakis J.G. Russillo, Jr., W.A. Therrien, and S.D. Velte, assigned to the same assignee as the present invention, and hereby incorporated by reference. FIG. 8 shows the optional output circuit board 210 assembled within the energy meter 2. Referring to FIG. 8, it is to be noted that the output board 210 is secured about post 181 by clamp 111, and that the three wire cable 87 leading from outside the energy meter 2 passes through the base 20 at aperture 97. Weather-proofing seal 99 is positioned within aperture 97 and the conductors 105, 107 and 109 pass through and connect to the screw terminals 59, 61 and 63. The cable 87 is secured to the post 181 by the insulated lacing tie 83, all as described in more detail in the aforesaid U.S. Pat. application, Ser. No. 505,287.

FIG. 8 also shows the electrical connection of the electronic register 8 to the power lines being metered; and also to the wattmeter to obtain power for the electronic circuitry of the electronic register 40. The register enclosure 40 includes a first connector slot 214 and a second connector slot 216 extending axially along the periphery of the register enclosure (also see FIG. 4). The first connector slot 214 provides an axial passageway 222 through which a female connector 218 may be slid to mate with, and provide electrical connection to, the male connector 220 on the register circuit board 80 (see FIG. 5). The electrical leads 41 associated with the female connector 218 pass through the sleeving 49 to the optional output circuit board 210, providing electrical connection between the register circuit board 80 and the optional output circuit board 210. It is to be noted that the molded integral register enclosure 40 assists in positioning and securing the female connector 220 relative to the first connector slot 214 to ensure contact and mating with the male connector 220 on the register circuit board 80. Positioning slot 238 in register enclosure 40 extends below the first connector slot 214 to allow the insertion of projection 240 on the female connector 218 only if the female connector is properly oriented for proper mating with male connector 220. Power from the lines to which the circuit I0 terminals 22 and 24 are connected is provided through conductors 224 and 226, and through detachable connector 228 to the conductors 230 and 232, which in turn pass through the second connector slot 216 to the register printed circuit board 80. Accordingly, positioning and securing the electrical connections to the electronic register 8 is facilitated and/or provided by the register enclosure 40.

Thus, we have provided an energy meter in which an electronic register 8 may be selectively added, during or even after the manufacture of the high volume standard induction watthour meter 4. The molded integral register enclosure provides proper positioning and the means to fasten substantially all of the components of the electronic register in the proper relationship to one another to enable their cooperative operation. Moreover, the integrated design with multi-function structural elements facilitates the assembly of the electronic register 8 with a minimum of components and hardware, a minimum of manufacturing and assembly time, and increased reliability through the decreased number of parts and the assembly and mounting guides which preclude incorrect mounting and connections. In addition, the integral register enclosure 40 also facilitates and enables the proper mounting of the electronic register 8 within the energy meter 2, and even facilitates and allows still further optional features which may be added. As a result, the present invention incorporates a flexible modular construction in which each of the principal modules are provided with a basic structure enabling customization during, or even after, manufacture. Detachable components and connectors shorten the time and effort required to customize the energy meter, while at the same time minimizing chances of assembly error.

The energy meter 2 is readily adaptable to mass production of basic components such as the induction watthour meter 4, the electronic register 8, the optional output board 210, and features such as the function and mode switches mounted on tubular members 74 and 76, and the combination test mode actuator-indicator in opening 176 and slot 178. The mass produced basic components can then be selectively combined to meet substantially all foreseeable customer requirements with a minimum of parts, and a maximum of flexibility. This allows the manufacturer great flexibility in stocking basic modules and components, with late point feature identification which can be readily incorporated to customize the basic meter to meet the differing customers' specifications and requirements. This simplified and less costly energy meter is efficient not only in manufacture, but also in the stocking of spare parts and in the repair and maintenance of the meter.

In addition, the integral injection molded register enclosure 40 has been used as the positioning and mounting member for substantially all, if not all, of the operative assemblies and components which require accurate positioning relative to each other eliminating the cumulative tolerance buildup which may occur I0 when multiple separate parts are used, each with its own tolerance band, such that if all parts in a sequence are high in the dimension tolerance band, the cumulative tolerance can add to provide positioning and operational problems. Furthermore, the components and assemblies being secured to a common member are in many cases positioned in parallel, rather than in series, minimizing the size of the electronic register 8. Furthermore, the electronic register 8 is essentially positioned beside, and parallel to, the induction watthour meter 4, keeping the overall size and dimensions of the energy meter 2 quite small, a customer and desirable requirement. Still further, many of the structural members are multi-functional parts serving more than a single function.

It is to be noted that even though the liquid crystal display 36 is substantially level with the dial reading assembly 6 that the electronic register 8 and the induction watthour meter 4 are built upward from the base 20 in substantially parallel, rather than series, structures. That is, in order to meet the objectives and requirements of present day energy meters, the electronic register 8 has been built beside a substantial portion of the watthour meter 4 and deliberately configured to occupy essentially unused space adjacent the vertically extending eddy current disk 38 and adjacent the gearing connecting that disk to the dial reading assembly 6. This configuration minimizes the size of the combined watthour meter and electronic register, and in fact adds no additional overall size to the watthour meter even though an electronic register and other parts such as the optional output board are added.

Thus, while the present invention has been described through preferred embodiments, such embodiments are provided by way of example only. Numerous variations, changes and substitutions, including those discussed above, will occur to those skilled in the art without departing from the scope of the present invention in the following claims.

What we claim is:

1. An electric energy meter including a watthour meter utilizing an eddy current disk rotating in response to energy consumed by the load being metered and including a power integrating and indicating means positioned substantially on one side of the eddy current disk, an electronic register assembly to provide time of use or demand energy readings configured to be selectively added within the electric energy meter on the other side of the eddy current disk comprising:
   a disk sensing optics assembly including one or more pairs of light emitters and light detectors positioned on either side of a castellated shutter which is coupled to, and rotates with, said eddy current disk;
   said disk sensing optics assembly being positioned on a register circuit board;
   a register enclosure configured for mounting on the other side of said eddy current disk beside said power integration and indicating means;
   said register circuit board being mounted on mounting means integral with said register enclosure;
   a display positioned at one end of said register enclosure through display positioning means integral with said register enclosure;
   said register enclosure further including integral members for supporting and positioning other components of said electronic register;
   said other components including an optical readout assembly for optical communications between said electronic register and the outside of said energy meter;
   means to connect said electronic register in circuit with power lines being metered;
   circuitry of said electronic register assembly providing energy readings; and
   register positioning means integral with said register enclosure to position said electronic register assembly adjacent to said side of said eddy current disk opposite said power integrating and indicating means of said watthour meter.

2. An electronic register assembly configured to be selectively added to an energy meter of claim 1 wherein said other components of said electronic register are positioned by said register enclosure in positive operative and cooperative relationship.

3. An electronic register assembly configured to be selectively added to a watthour meter of claim 2 wherein said register circuit board is positioned within said register enclosure between said disk sensing optics assembly and said optical readout assembly.

4. An electronic register assembly configured to be selectively added to a watthour meter of claim 3 wherein optical components of an optical readout assembly are supported on said register circuit board.

5. An electronic register assembly configured to be selectively added to a watthour meter of claim 4 wherein said optical components include a light emitter and light detector positioned within a light enclosure formed integrally within said register enclosure.

6. An electronic register assembly configured to be selectively added to a watthour meter of claim 5 wherein said light emitter and light detector of said optical readout assembly are positioned within one or more openings formed integrally within said light enclosure proximate to said integral display.

7. An electronic register assembly configured to be selectively added to a watthour meter of claim 6 wherein said register enclosure includes integral adaptor positioning means for a programming adaptor to provide optical communications to said electronic register from outside of said energy meter.

8. An electronic register assembly configured to be selectively added to a watthour meter of claim 7 wherein said integral adaptor positioning means for said programming adaptor includes a flatted side of said optical readout aperture and a rib separated therefrom.

9. An electronic register assembly configured to be selectively added to a watthour meter of claim 1 wherein said integral register positioning means for positioning and securing said electronic register within said energy meter.

10. An electronic register assembly configured to be selectively added to a watthour meter of claim 9 wherein said integral register positioning means includes three or more separated positioning means.

11. An electronic register assembly configured to be selectively added to a watthour meter of claim 10 wherein said positioning means includes at least two mounting bosses integral with said register enclosure, and a snap member adapted to be secured around a portion of the bearing within which the shaft which is connected to said eddy current disk and castellated shutter rotates, providing operative positioning between said castellated shutter and said disk sensing optics assembly by said register enclosure.

12. An electronic register assembly of claim 1 wherein a shroud integral with said register enclosure surrounds at least a portion of two or more of said at least two mounting bosses to guide said register enclosure onto said energy meter without physical contact between said castellated shutter and said disk sensing optics assembly.

13. An electronic register assembly configured to be selectively added to a watthour meter of claim 12 wherein said at least two mounting bosses are two mounting bosses.

14. An electronic register assembly configured to be selectively added to a watthour meter of claim 1 wherein said register enclosure includes an integral display aperture within said register enclosure, and at least two integral retainers adjacent opposite sides of said integral display aperture, and a retainer clip is configured to be positioned across the open end of said integral display aperture between said integral retainers to retain said display within said integral display aperture positioned between said retainer clip and said register enclosure.

15. An electronic register assembly configured to be selectively added to a watthour meter of claim 14 wherein each end of said retainer clip includes an integral clip for securing said retainer clip to said integral retainers.

16. An electronic register assembly configured to be selectively added to a watthour meter of claim 15 wherein said retainer clip is generally elongated and is molded with a curvature, and said integral clips on the ends of said retainer clip are shaped as jaws.

17. An electronic register assembly configured to be selectively added to a watthour meter of claim 16 wherein the jaws of said retainer clip are clipped around said integral retainers, and said curvature provides resilient pressure to secure said retainer clip to said integral retainers and retain said display in said display aperture.

18. An electronic register assembly configured to be selectively added to a watthour meter of claim 17 wherein said register enclosure includes an integral rim surrounding said integral display aperture on the side of said register enclosure opposite said display.

19. An electronic register assembly configured to be selectively added to a watthour meter of claim 18 wherein a slot through said rim and a test mode actuator opening within said register enclosure adjacent to said rim are provided to secure a switch actuator-indicator adjacent said display.

20. An electronic time of use or demand register assembly configured for selective addition to an energy meter of claim 1 wherein said watthour meter is initially manufactured including said castellated shutter to facilitate the subsequent selective addition of said electronic register.

21. An electronic time of use or demand register assembly configured for selective addition to an energy meter of claim 1 wherein said register enclosure includes one or more adjustment apertures through said register enclosure to provide access to adjustments for said watthour meter.

22. An electronic time of use or demand register assembly configured for selective addition to an energy meter of claim 1 wherein said energy meter includes means to selectively add an output circuit board to provide signals from said electronic register assembly to the outside of said energy meter through the base of said energy meter.

23. An electric energy meter including a watthour meter utilizing an eddy current disk rotatably supported for rotation in response to energy consumed by the load being metered and including a power integrating and indicating means positioned substantially on one side of the eddy current disk, an electronic register assembly configured to be selectively added to the electric energy meter on the other side of the eddy current disk comprising:
an optical disk assembly including one or more pairs of light emitters and light detectors positioned on either side of a castellated shutter which is coupled to, and rotates with, said eddy current disk;
said optical disk assembly being positioned on a register circuit board;
a register enclosure configured for mounting on said other side of said eddy current disk beside said power integration and indicating means;
said register circuit board being mounted on support means integral with said register enclosure;
a display positioned at one end of said register enclosure through display positioning and support means integral with said register enclosure;
said register enclosure further including integral members for supporting and positioning other components of said electronic register relative to each other;
said other components including an optical readout assembly for optical communications between said electronics register and the outside of said energy meter and including optical elements mounted on said register circuit board and positioned within said register enclosure;
means to connect said electronic register in circuit with power lines being metered;
circuitry of said electronic register assembly providing energy readings; and
register mounting means integral with said register enclosure to mount said register assembly adjacent said side of said eddy current disk opposite said power integrating and indicating means of said watthour meter.

24. An electronic time of use or demand register assembly configured for selective addition to an energy meter of claim 23 wherein said integral members for supporting and positioning other components includes one or more connector openings for the electrical connection of said register assembly within said energy meter.

25. An electronic time of use or demand register assembly configured for selective addition to an energy meter of claim 24 wherein said one or more openings includes a slot to position and hold one or more electrical connectors in contact with one or more mating electrical connectors on said register circuit board.

26. An electronic time of use or demand register assembly configured for selective addition to an energy meter of claim 25 wherein one of said one or more electrical connectors are connected in circuit with the power consumption being metered by said energy meter.

27. An electronic time of use or demand register assembly configured for selective addition to an energy meter of claim 23 wherein another opening integral with said register enclosure forms a battery chamber to position and support a battery to provide backup power to a microprocessor in said electronic register assembly.

28. An electronic time of use or demand register assembly configured for selective addition to an energy meter of claim 27 wherein a plurality of battery positioning and securing members are positioned about said battery chamber integral with said register enclosure.

29. An electronic time of use or demand register assembly configured for selective addition to an energy meter of claim 28 wherein one or more of said battery positioning and securing members positioned about said battery chamber include cantilevered clips formed integral with said register enclosure.

30. An electronic time of use or demand register assembly configured for selective addition to an energy meter of claim 29 wherein a battery is positioned in said battery chamber, said battery being rechargeable.

31. An electronic time of use or demand register assembly configured for selective addition to an energy meter of claim 23 wherein said other components of said electronic register assembly are positioned by said register enclosure in positive operative and cooperative relationship.

32. An electronic time of use or demand register assembly configured for selective addition to an energy meter of claim 31 wherein said register circuit board is positioned within said register enclosure between said disk sensing optics assembly and said display.

33. An electronic time of use or demand register assembly configured for selective addition to an energy meter of claim 32 wherein said disk sensing optics assembly is supported on said register circuit board.

34. An electronic time of use or demand register assembly configured for selective addition to an energy meter of claim 23 wherein said integral register positioning means for securing said register assembly within said energy meter.

35. An electronic time of use or demand register assembly configured for selective addition to an energy meter of claim 34 wherein said integral register positioning means includes three or more separated positioning means.

36. An electronic time of use or demand register assembly configured for selective addition to an energy meter of claim 35 wherein said integral register positioning means includes three separated positioning means, two of which are mounting bosses molded integral with said register enclosure.

37. An electronic time of use or demand register assembly configured for selective addition to an energy meter of claim 36 wherein the third separated positioning means is a snap member adapted to be secured around a portion of the bearing within which the shaft which is connected to the eddy current disk and to the castellated shutter rotates, providing operative positioning between said castellated shutter and said disk sensing optics assembly by said register enclosure.

38. An electronic time of use or demand register assembly configured for selective addition to an energy meter of claim 37 wherein said register enclosure includes shrouds surrounding a portion of each of said two mounting bosses to guide said register circuit board and the optical readout assembly secured to said register circuit board into proper positioning between said disk sensing optics assembly and said castellated shutter without contact with the teeth of the shutter.

39. An electronic time of use or demand register assembly configured for selective addition to an energy meter of claim 38 wherein said watthour meter includes gearing to integrate the rotation of said eddy current disk, and said electronic register is mounted in said energy meter adjacent said gearing.

40. An electronic time of use or demand register assembly configured for selective addition to an energy meter of claim 39 wherein said energy meter includes a base and nameplate bosses which extend upward from said base and said mounting bosses are molded integral with said register enclosure to surround, at least in part, said nameplate bosses, said nameplate bosses being adapted to secure one portion of a substantially semi-circular nameplate prior to the selective addition of said electronic register assembly.

41. An electronic time of use or demand register assembly configured for selective addition to an energy meter of claim 40 wherein a nameplate is included and said electronic register assembly overlies said nameplate.

42. An electronic time of use or demand register assembly configured for selective addition to an energy meter of claim 41 wherein said electronic register assembly is substantially mounted in parallel with said watthour meter between the base of said energy meter and said nameplate.

* * * * *